(12) United States Patent
Steffen

(10) Patent No.: US 6,303,474 B1
(45) Date of Patent: *Oct. 16, 2001

(54) READ-ONLY MEMORY AND FABRICATION METHOD

(75) Inventor: Christian Steffen, München (DE)

(73) Assignee: Infineon Technologies AG, Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/494,775

(22) Filed: Jan. 31, 2000

Related U.S. Application Data

(63) Continuation of application No. PCT/DE98/01585, filed on Jun. 9, 1998.

(30) Foreign Application Priority Data

Jul. 29, 1997 (DE) ............................................. 197 32 640

(51) Int. Cl.[7] .................................................. H01L 21/425
(52) U.S. Cl. ........................ 438/514; 438/257; 438/262; 257/296; 257/390; 257/369
(58) Field of Search ..................................... 438/519, 560, 438/514, 525, 531, 257, 258, 261, 262–264, 265–267; 257/296, 390, 369

(56) References Cited

U.S. PATENT DOCUMENTS 5,480,747 * 1/1996 Vasudev .................................. 430/5
5,554,552 * 9/1996 Chi ....................................... 438/264

OTHER PUBLICATIONS

Wolf et al, Silicon Processing for the VLSI ERA, vol. 1.*
Wolf et al, Silicon Processing for the VLSI ERA, vol. 1, pp. 510–511, 1986.*
Meir Janai: "Technologies for economic Production of ASICs", Solid State Technology, Mar. 1993, pp. 35–37.
Roelof W. Wijnaendts–van–Resandt et al.: "Super Resolution Lithography using a Direct Write Laser Pattern Generator", Proceedings of the SPIE–The International Society for Optical Engineering, 1994, vol. 2213, pp. 18–23.
Stanley Wolf et al.: "Silicon Processing For the VLSI Era, vol. I: Process technology", Lattice Press, Sunset Beach, CA, pp. 510–511.

* cited by examiner

*Primary Examiner*—Charles Bowers
*Assistant Examiner*—Hsien-Ming Lee
(74) *Attorney, Agent, or Firm*—Herbert L. Lerner; Laurence A. Greenberg; Werner H. Stemer

(57) ABSTRACT

The read-only memory takes the form of an integrated circuit. The data stored in the read-only memory include a first data record and a second data record in the form of corresponding first and second structures, respectively, of the integrated circuit. The first structures are fabricated by means of a lithographic projection method with the use of a mask and the second structures are fabricated by means of a lithographic beam writing method without the use of a mask. The invention enables the storage of individual, specialized data for the read-only memory within a primarily mask-programmed ROM.

7 Claims, 3 Drawing Sheets

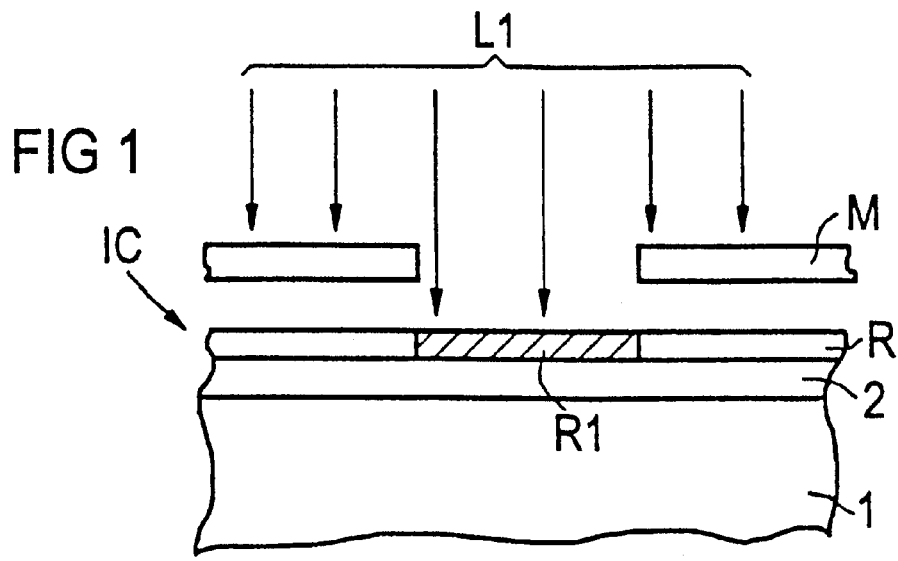
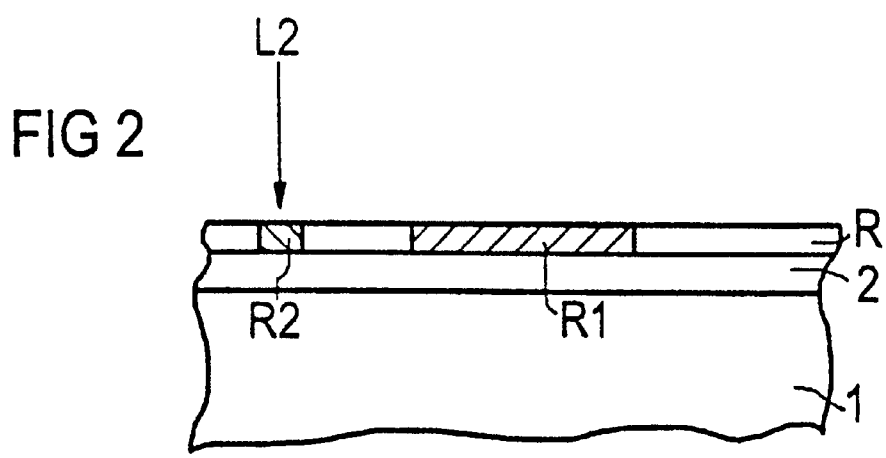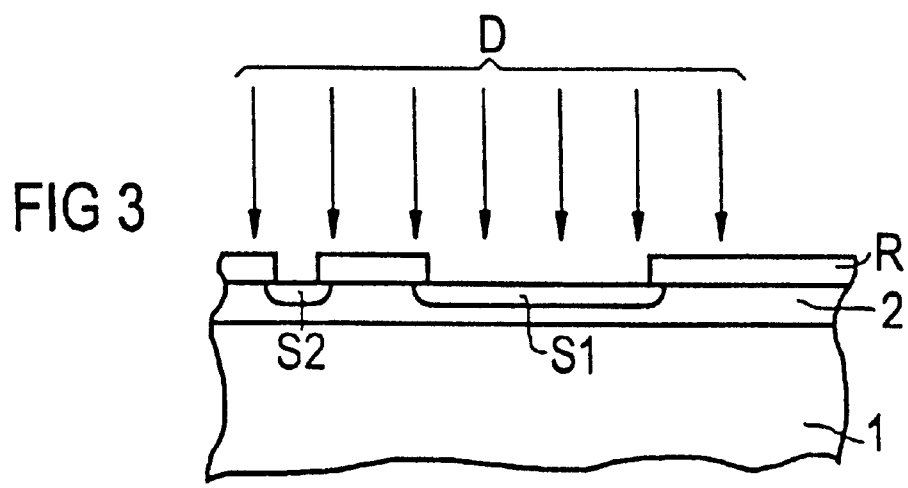

READ-ONLY MEMORY AND FABRICATION METHOD

CROSS-REFERENCE TO RELATED APPLICATIONS

This is a continuation of copending International Application PCT/DE98/01585, filed Jun. 9, 1998, which designated the United States.

BACKGROUND OF THE INVENTION

Field of the Invention

The invention relates to a read-only memory and to a method for fabricating the memory.

Read-only memories are widely referred to as ROMs. They are nonvolatile memories which cannot be erased. The so-called mask ROM is widespread in practice. The read-only memory is fabricated as an integrated circuit whose individual layers are fabricated by means of lithographic projection methods. In order to carry out a lithographic projection method, first of all a resist layer is applied to a planar layer of the integrated circuit. Afterwards, through a corresponding mask, the entire resist layer is exposed simultaneously at the locations left free by the mask. The mask is then removed and the resist layer is developed and its exposed parts are removed. The remaining parts of the resist layer are subsequently used for further processing of the integrated circuit, for example for an etching process or for a dopant implantation process.

The lithographic projection method outlined above is the most frequently used lithographic method for the fabrication of integrated circuits. Owing to the whole-area exposure (projection) of the resist layer, that method requires the production of the masks outlined above. Once the masks are available, however, they can be used to fabricate a large number of identical integrated circuits in a short period of time.

In addition to the lithographic projection methods outlined above, lithographic beam writing methods are also known. There, the exposure of a resist layer is effected by means of an electron beam or an ion beam. Such a beam which can be controlled by electric fields enables very fine structures to be fabricated and makes it unnecessary to produce masks of the kind necessary for the lithographic projection methods. The disadvantage of the beam writing methods is that the desired exposure of the resist layer is significantly more timeconsuming than in the case of the exposure carried out over the full area in the projection methods. Therefore, the lithographic beam writing methods are used only for fabricating very small structures within integrated circuits that are fabricated in small numbers.

Read-only memories are frequently used in smart cards, where they serve as memories for a processor likewise disposed in the smart card. For example, the microcode required by the processor is then stored in the ROM. In many applications (for example in a credit card or charge card context), it is additionally necessary, for security reasons, to store an individual identifier (for example a PIN number) in each smart card. Since the customary mask programming of the ROM does not permit storage of individual data for each smart card in the ROM, the individual identifier is stored in an EEPROM (Electrically Erasable Programmable ROM) that is additionally provided in the smart card for this purpose.

Due to the fact, however, that it can be erased, an EEPROM has the disadvantage that manipulation of the security-relevant data stored in it cannot be precluded.

SUMMARY OF THE INVENTION

The object of the invention is to provide a read-only memory and a related production method, which overcome the abovenoted deficiencies and disadvantages of the prior art devices and methods of this kind, and which render it possible to store both a first data record, which contains a large number of standard data (for example the microcode of a processor), and a second data record, which contains a small number of individual data (for example a PIN number).

With the above and other objects in view there is provided, in accordance with the invention, a method for fabricating a read-only memory in an integrated circuit, which comprises:

fabricating first structures of an integrated circuit by means of a lithographic projection method with the use of a mask and storing a first data record in the form of the first structures; and fabricating second structures of the integrated circuit by means of a lithographic beam writing method without the use of a mask and storing a second data record in the form of the second structures.

In other words, the objects of the invention are satisfied in that the first data record to be stored by the formation of corresponding first structures and the second data record to be stored by the formation of corresponding second structures within an integrated circuit of a common read-only memory or ROM. In this case, the first structures are fabricated by means of a lithographic projection method with the use of a mask and the second structures are fabricated by means of a lithographic beam writing method without the use of a mask.

The use of the lithographic projection method (customary for the fabrication of ROMs) enables the first structures holding the first data record—to be fabricated rapidly and effectively. The first data record therefore involves data which are to be stored in the same way in a multiplicity of ROMs to be fabricated. The use of the lithographic beam writing method in the manner according to the invention makes it possible, on the other hand, for the data of the second data record to be individually different for each read-only memory to be fabricated. If the read-only memory is used in a smart card, by way of example, the second data record may be a PIN number, a serial number or a key which is necessary for the encryption (cryptology) of data to be stored in the smart card. In these cases, the second data record contains only a small number of data, with the result that the second structures take only a short time to fabricate despite the use of a lithographic beam writing method.

In accordance with an added feature of the invention, the first and second structures are fabricated with a common resist layer. The common resist layer is exposed through the mask for producing the first structures (projection method) and without the mask for producing the second structures (beam writing method). This procedure means that altogether only one resist layer is required for fabricating the first and second structures. This has the advantage that the first and second structures are produced in the same plane of the integrated circuit in directly succeeding fabrication steps.

In accordance with an additional feature of the invention, the resist layer is patterned after exposure, and the first and second structures are formed by implanting dopants via the patterned resist layer. In other words, the resist layer which has been successively exposed by means of the projection method and the beam writing method is patterned, and the first and second structures are formed by the implantation of dopants with the use of the patterned resist layer. In this way, it is possible, in an advantageous manner, for example to set the doping of channels of field-effect transistors for the purpose of storing the two data records, as will be explained further below using the exemplary embodiment.

In accordance with again another feature of the invention, lithographic beam writing methods to be taken into consideration are, in particular, electron beam writing and ion beam writing method. However, the resist layer can also be exposed using a laser beam writing method.

With the above and other objects in view there is also provided, in accordance with the invention, an integrated circuit read-only memory, which comprises:

first structures in the integrated circuit fabricated by means of a lithographic projection method with the use of a mask, the first structures storing a first data record; and second structures in the integrated circuit fabricated by means of a lithographic beam writing method without the use of a mask, the second structures storing a second data record of the read-only memory.

In accordance with again a further feature of the invention, the second data record contains an individual identifier and/or an individual coding key.

The above-outlined integrated read-only memory is particularly suitable for incorporation in a smart card or the like.

Other features which are considered as characteristic for the invention are set forth in the appended claims.

Although the invention is illustrated and described herein as embodied in a read-only memory and method for the fabrication thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 3 are partial, diagrammatic sectional views showing successive steps of a fabrication method according to the invention;

DESCRIPTION OF THE PREFERRED EMBODIMENTS

Figure 4:
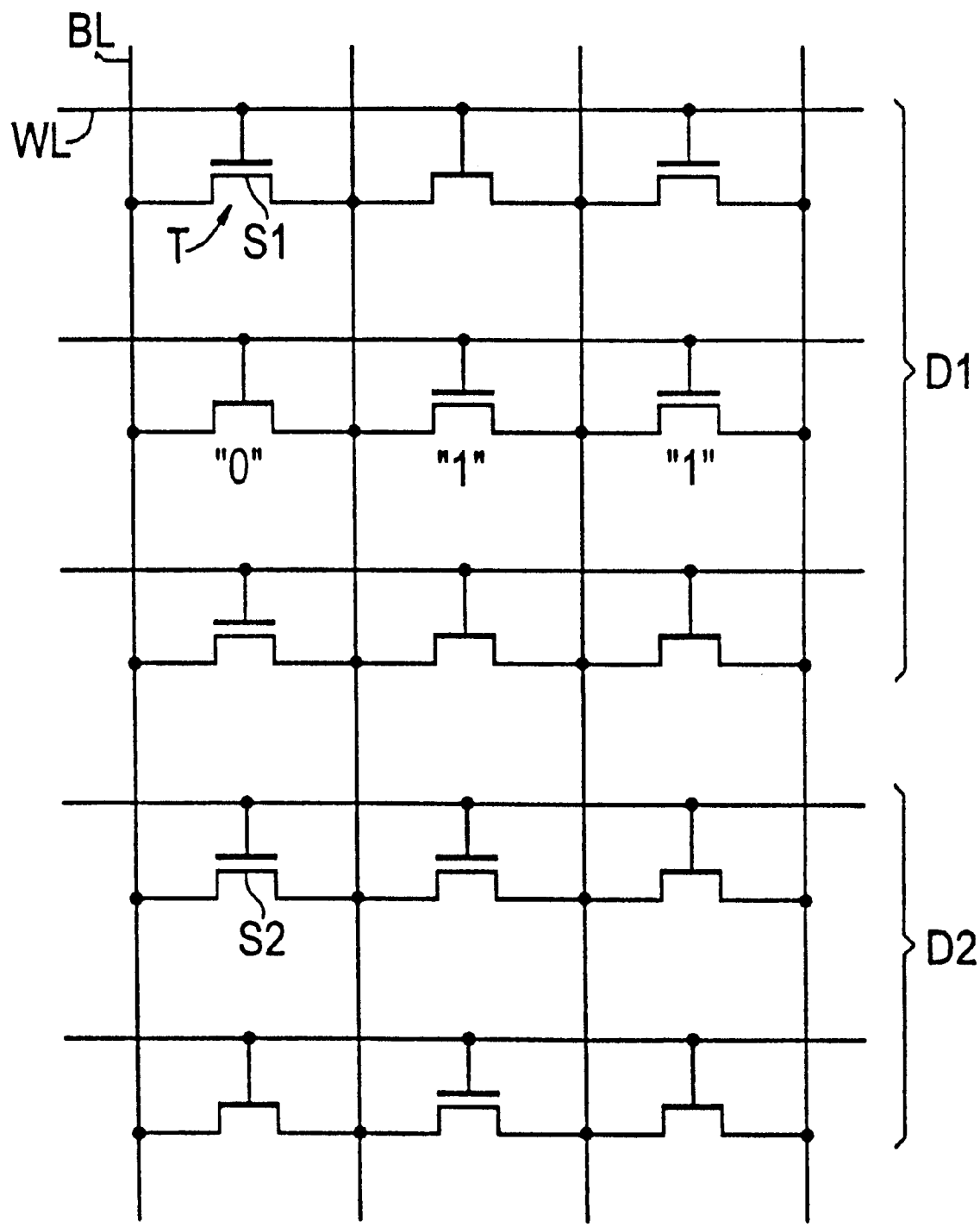
FIG. 4 is a basic circuit diagram of a completed read-only memory.

Referring now to the figures of the drawing in detail and first, particularly, to FIG. 1 thereof, there is seen a silicon substrate 1 with a polysilicon layer 2 applied thereon and a resist layer R applied in turn on the poly-Si layer 2. In order to fabricate the read-only memory according to the invention, the resist layer R is first of all exposed by means of a lithographic projection method L1 with the use of a mask M in regions R1. Afterwards, the mask M is removed and, as shown in FIG. 2, further regions R2 of the resist layer R are exposed by means of a lithographic beam writing method L2, in this case by means of an electron beam writing method. The electron beam can be controlled by means of an electric field.

As shown in FIG. 3, the exposed parts R1, R2 of the resist layer R are removed and a dopant D is subsequently implanted into the polysilicon layer 2. In this way, underneath the parts R1 of the resist layer R which have been exposed by means of the lithographic projection method L1, first structures S1 and, underneath the parts R2 of the resist layer R which have been exposed by means of the beam writing method L2, second structures S2 are fabricated in the form of doped regions within the polysilicon layer 2.

Referring now to FIG. 4, there is shown a part of the basic circuit diagram of a read-only memory ROM according to the invention which has been fabricated by means of a fabrication method as shown in FIGS. 1 to 3. The ROM has word lines WL running horizontally and bit lines BL running vertically. The word lines WL are connected to the gates of field-effect transistors T. Source/drain terminals of the transistors T are connected to a respective one of the bit lines BL. Only the production of the structures S1, S2, which form channel regions of the transistors T in FIG. 4, was illustrated in FIGS. 1 to 3. The word lines WL, bit lines EL and source/drain terminals are fabricated in conventional process steps which are known to t hose of skill in this art and which are, therefore, not illustrated in this specification.

The top three word lines WL in FIG. 4 serve for the storage of a first data record D1, while the last two word lines serve for the storage of a s econd data record D2.

In some of the transistors T in FIG. 4, no channel is illustrated between the source/drain terminals. In the case of these transistors, exposure of the resist layer R as shown in FIGS. 1 and 2 was effected neither by the projection method L1 nor by the beam writing method L2. Therefore, these channel regions were not doped with the dopant D (as shown in FIG. 3). Such an undoped channel does not become conductive even if the associated gate is activated via the corresponding word line WL. These transistors T with undoped channels represent data of the state "0", within the first data record D1 and the second data record D2 in the exemplary embodiment as shown in FIG. 4.

In those transistors T in FIG. 4 wherein the channel region has been doped as shown in FIG. 3, the corresponding drain/source terminals are connected to one another via the channel illustrated as a horizontal line. These transistors T represent the state "1" within the two data records D1, D2. Within the first data record D1, the doped channels correspond to the first structures S1 from FIG. 3, while the doped channels within the second data record D2 correspond to the second structures S2 from FIG. 3.

The read-only memory illustrated in FIG. 4 is read by the application of a potential to one of the bit lines of the transistor T to be read and the activation of the word lines WL connected to its gate. By observing the potential on the second bit line BL connected to the same transistor T, it is possible to identify whether or not the transistor conducts, that is to say whether or not it has a doped channel region and has thus stored a logic "1" or a logic "0".

Since the first structures S1 of the first data record D1 are produced by means of a lithographic projection method L1, which makes it necessary to use a mask M (FIG. 1), the data record D1 involves those data which are to be stored in a multiplicity of read-only memories to be fabricated. The data record D1 may therefore involve, for example, data which are required by a processor, such as, for example, its microcode or tables which it requires. In the case of the second data record D2, the use of a lithographic beam writing method L2 (FIG. 2) in the manner according to the invention enables that data record to have different data for each read-only memory to be fabricated. Since the production of the second structures S2 does not require a mask, the electron beam used for the lithography can in each case be controlled individually.

The invention has the advantage that no EEPROM has to be provided for the storage of a second data record D2 with data which are individually different for each memory or small batch of memories to be fabricated, rather a read-only memory which is necessary in any case for storing a first data record D1 can be used for this purpose. By avoiding the use of an EEPROM for storing the data of the data record D2 which are individually different for each read-only memory, the possibility of manipulating such data is also obviated, since the second structures S2 can only be produced within the process for fabricating the read-only memory and, unlike EEPROMs, cannot be erased.

Due to the fact that a common resist layer is used for the lithographic projection method L1 and the lithographic beam writing method L2 and due to the production of identical structures S1, S2, the outlay for fabricating the read-only memory according to the invention is increased only slightly relative to the fabrication of a straightforward mask ROM.

Since, as a rule, many further layers are applied above the layers of the integrated circuit IC which are shown in FIGS. 1 to 3, unauthorized reading of the read-only memory is also made considerably more difficult. This is because, in order to analyze the structures S1 and S2 for the purpose of reading the two data records D1, D2, the layers of the integrated circuit IC which lie above them have to be removed, with the result that the read-only memory is then destroyed. The knowledge of the contents of the individual second data record D2 which is characteristic of the read-only memory is then worthless, since the integrated circuit can then no longer be operated. The second data record D2 may therefore involve data relevant to security, such as, for example, a PIN number, a serial number of the read-only memory or a code key for the encryption or decryption of data. Pin numbers and code keys, in particular, are regularly used in chip cards and smart cards.

Since a code key stored in the read-only memory in the form of the second data record D2 cannot be read externally, two different code keys could be stored within the second data record D2. One of these keys is a public key, that is to say it can be read out by anybody via the word lines WL and bit lines BL in FIG. 4. The other key, on the other hand, cannot be read out to a point outside the smart card. By way of example, the hidden key would be created by means of a random number generator and be passed on together with the public key in a strictly confidential reference list to authorized users. Key methods with a public and a hidden key part are nowadays recognized as secure to a very great extent, for example PGP (Pretty Good Privacy) with a 64-bit key. Such a method would be suitable in particular as a security measure in smart card ICs, for example in applications such as electronic cash banking cards, patient cards for medical insurance, or electronic identity cards.

Figure 5:
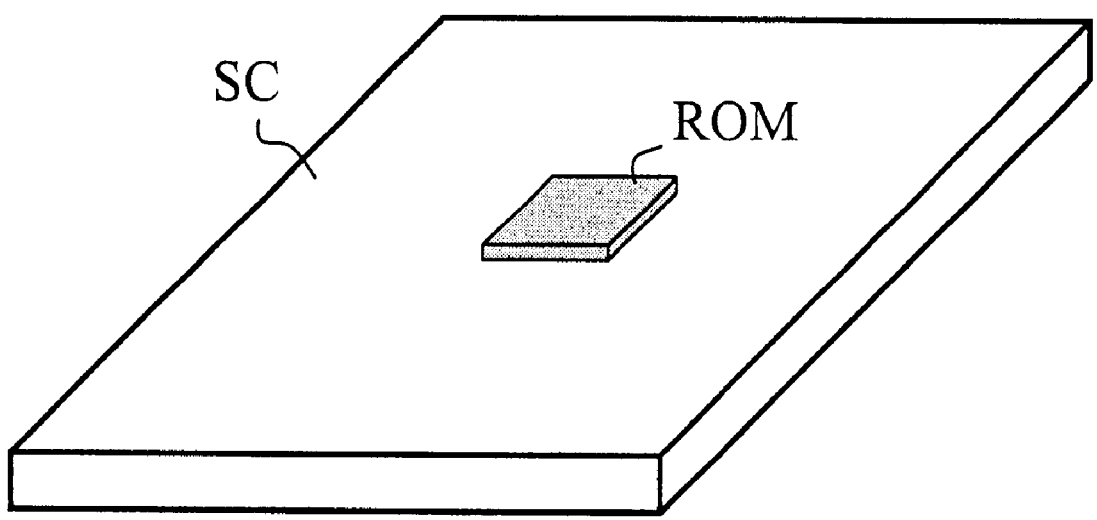
FIG. 5 is a diagrammatic perspective view of a smart card with a read-only memory produced according to the invention.

FIG. 5 illustrates, in diagrammatic fashion, a smart card SC with a read-only memory ROM according to the invention. Smart cards of this type, and the incorporation of a ROM chip or ROM module are well known in the art. Reference is had, for example, to the commonly owned, copending application Ser. No. 09/390,494, the pertinent disclosure of which is herewith incorporated by reference.

I claim:

1. A method for fabricating an integrated circuit read-only memory, which comprises:

fabricating first structures of an integrated circuit by means of a lithographic projection method with the use of a mask and storing a first data record in the form of the first structures;

fabricating second structures of the integrated circuit by means of a lithographic beam writing method without the use of a mask and storing a second data record in the form of the second structures;

performing the steps of fabricating the first and second structures with a common resist layer; and exposing the common resist layer through the mask for producing the first structures and without the mask for producing the second structures.

2. The method according to claim 1, which comprises patterning the resist layer after exposure, and forming the first and second structures by implanting dopants via the patterned resist layer.

3. The method according to claim 1, which comprises selecting the lithographic beam writing method from the group consisting of an electron beam writing method, an ion beam writing method, and a laser beam writing method.

4. An integrated circuit read-only memory, which comprises:

first structures in the integrated circuit fabricated by means of a lithographic projection method with the use of a mask, said first structures storing a first data record;

second structures in the integrated circuit fabricated by means of a lithographic beam writing method without the use of a mask, said second structures storing a second data record of the read-only memory, the second data record containing an individual identifier for the read-only memory.

5. The read-only memory according to claim 4, wherein the second data record contains an individual identifier for the read-only memory and an individual coding key.

6. The read-only memory according to claim 4, wherein the second data record contains an individual coding key.

7. In combination with a smart card, a read-only memory disposed in the smart card, comprising:

first structures in the integrated circuit fabricated by means of a lithographic projection method with the use of a mask, said first structures storing a first data record;

second structures in the integrated circuit fabricated by means of a lithographic beam writing method without the use of a mask, said second structures storing a second data record of the read-only memory, the second data record containing an individual identifier for the read-only memory.

* * * * *